United States Patent [19]
Jacobs

[11] Patent Number: 4,753,617
[45] Date of Patent: Jun. 28, 1988

[54] ELECTRICAL DEVICE HAVING FLEXIBLE ELECTRICAL CONTACTS

[75] Inventor: Brian D. Jacobs, San Francisco, Calif.

[73] Assignee: Raychem Corporation, Menlo Park, Calif.

[21] Appl. No.: 932,764

[22] Filed: Nov. 17, 1986

[51] Int. Cl.⁴ .................................... H01R 13/05
[52] U.S. Cl. ................................................ 439/825
[58] Field of Search ............... 339/64, 95 R, 252 R, 339/252 P

[56] References Cited

U.S. PATENT DOCUMENTS

| | | | |
|---|---|---|---|
| 2,927,953 | 3/1960 | Staller | 339/64 R |
| 3,348,191 | 10/1967 | Kinkaid . | |
| 3,380,012 | 4/1968 | Moulin | 339/95 R |
| 3,486,163 | 12/1969 | De Vuyst et al. . | |
| 3,523,273 | 8/1970 | Hammell et al. . | |
| 3,631,381 | 12/1971 | Pittman . | |
| 3,864,000 | 2/1975 | Coller et al. . | |
| 4,155,321 | 5/1979 | Tamburro . | |
| 4,547,944 | 10/1985 | Hayden . | |
| 4,655,382 | 4/1987 | Wong et al. . | |

Primary Examiner—Joseph H. McGlynn
Attorney, Agent, or Firm—Herbert G. Burkard

[57] ABSTRACT

There is disclosed an electrical device including first and second electrical components and at least one but usually a plurality of longitudinally-dimensioned flexible electrical contacts. The flexible contact (or contacts) connect the first electrical component to the second electrical component. The flexible contact (or contacts) each have a center portion of greater flexibility than its two end portions. This greater flexibility occurs along, and laterally with respect to, the longitudinal axis of the flexible contact. The flexible contact (or contacts) serve to accommodate relative misalignment of the first and second electrical components. There is also disclosed a method of making the flexible contact.

20 Claims, 2 Drawing Sheets

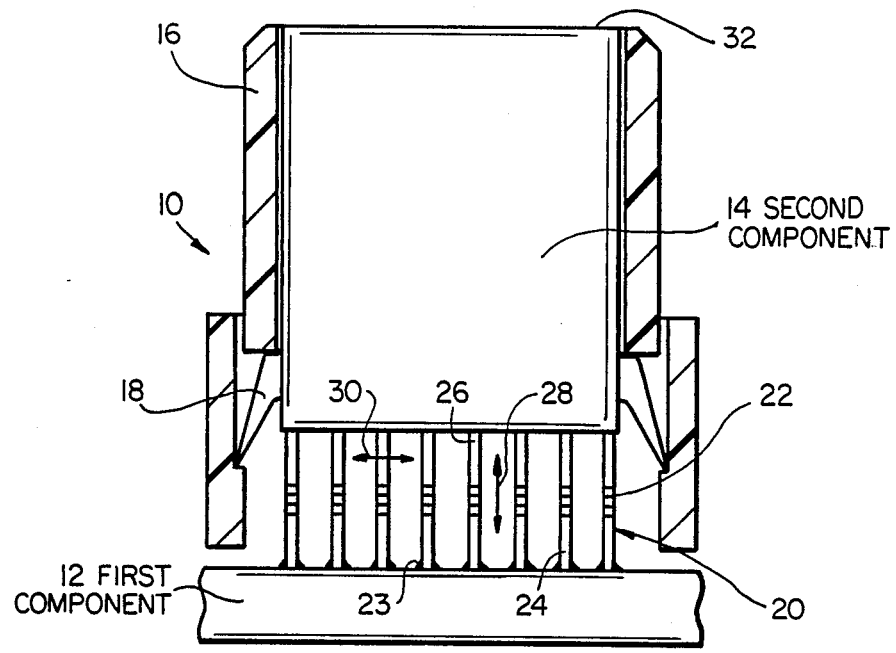
FIG_1
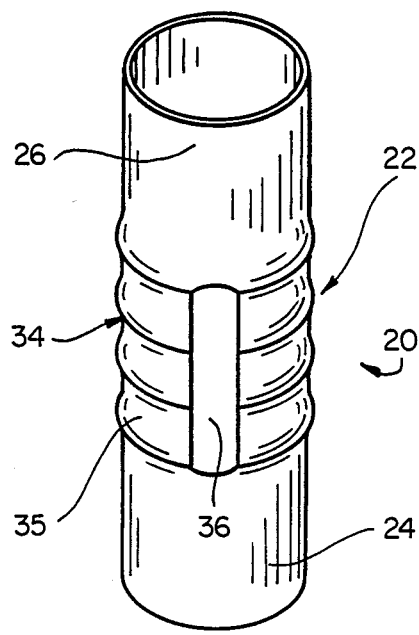
FIG_2

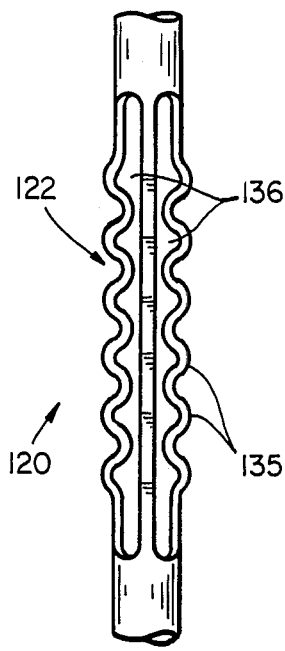
FIG_3
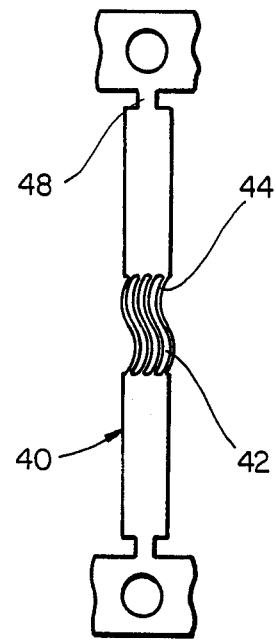
FIG_5
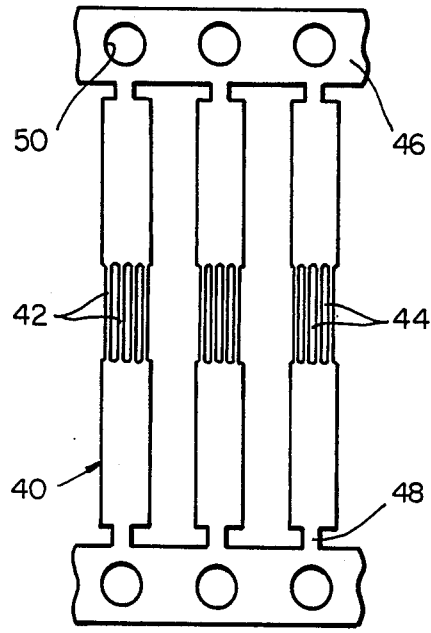
FIG_4

ELECTRICAL DEVICE HAVING FLEXIBLE ELECTRICAL CONTACTS

FIELD OF THE INVENTION

This invention relates to the field of electrical devices and particularly to those electrical devices which employ a substantial number of electrical contacts.

BACKGROUND OF THE INVENTION

With the advent of modular electrical devices such as printed circuit boards and printed circuit board connectors as well as other connectors, it is expected that there will be a substantial number of matings and dematings of the components making up the devices. As these devices may have a substantial number of electrical contacts, it is imperative that care be taken to avoid damaging any of them as this could cause an electrical malfunction of the system. Thus, if an electrical contact were bent, alignment with its respective socket would not be possible due to the rigidity of presently used contacts. It would, therefore, be desirable to have a flexible electrical contact that could compensate for the misalignment of the electrical contacts.

Too, one or both ends of the electrical contact may be soldered in place. Stress on the soldered joint may arise during movement of the contact as a result of, for example, mating forces. It would thus be desirable to have a flexible electrical contact that would serve to reduce the stress on the soldered joint.

Many of these modular electrical devices find use on military aircraft. It would, therefore, be further desirable to have an electrical contact that is rugged and reliable.

Various devices, connectors and electrical contacts have been proposed which provide electrical contacts having flexibility. Among these are Kinkaid U.S. Pat. No. 3,348,191, DeVuyst et al. U.S. Pat. No. 3,486,163, Hammell et al., U.S. Pat. No. 3,523,273, Pittman U.S. Pat. No. 3,631,381 and Coller et al., U.S. Pat. No. 3,864,000. All of these disclose electrical contacts having a reduced cross-sectional thickness which provides a certain amount of lateral flexibility. However, due to the fact that the reduced cross-section is square or rectangular, lateral flexibility will only be increased in certain lateral directions. There will be no increase in axial flexibility.

Tamburro U.S. Pat. No. 4,155,321 discloses a contact having an intermediate compliant section.

Hayden U.S. Pat. No. 4,547,944 discloses a tubular sleeve having a corrugated section which acts as a bellows. The tubular sleeve is used in a heat exchanger. The reference discloses that such a sleeve has axial flexibility. Hayden is but an example of uses to which a corrugated section or bellows may be put to use. A common use for a bellows is on a straw which allows a section of the straw to bend without crimping the straw.

Notwithstanding the plethora of remedies available, no one has yet proposed the solution to end the problems of the prior art.

Thus, it is an object of the invention to have an electrical devices with electrical contacts that are flexible.

It is another object of the invention to have an electrical connector with electrical contacts that are laterally and longitudinally flexible.

It is a further object of the invention to have an electrical connector with electrical contacts that are rugged and reliable.

It is yet another object of the invention to have a method to make the electrical contacts that is simple and inexpensive.

These and other objects of the invention will become more apparent after reference to the following description considered in conjunction with the accompanying drawings.

BRIEF SUMMARY OF THE INVENTION

One aspect of the invention relates to an electrical device comprising first and second electrical components and at least one longitudinally-dimensioned flexible electrical contact connecting the first and second electrical components. Usually, there will be a plurality of such flexible contacts. The flexible contact (or contacts) has a center portion of greater flexibility than its two end portions. The center portion has the greater flexibility along, and laterally with respect to, the longitudinal axis of the contact. The flexible contacts serve to accommodate relative misalignment of the first and second electrical components and reduce any stresses resulting from movement of the flexible contacts.

Another aspect of the invention relates to an electrical device comprising first and second electrical components and at least one longitudinally-dimensioned flexible electrical contact connecting the first and second electrical components. Usually there will be a plurality of such flexible contacts. The flexible contact (or contacts) has a bellows center portion of greater flexibility than its two end portions. The flexible contacts accommodate relative misalignment of the first and second electrical components and reduce any stresses resulting from movement of the flexible contacts.

In a further aspect of the invention there is a longitudinally-dimensioned flexible electrical contact comprising a center portion of greater flexibility than its two end portions. The center portion comprises a bellows having longitudinal slots therein and being defined by convolutions extending discontinuously around its periphery.

Yet another aspect of the invention relates to a method of making the flexible electrical contact. The method comprises first forming a generally planar longitudinally-dimensioned article having a center portion, cutting longitudinal slots in the center portion and then corrugating the center portion. The final step of the method comprises rolling the longitudinally-dimensioned article into a hollow, generally tubular shape with the center portion forming a bellows.

BRIEF DESCRIPTION OF THE DRAWINGS

FIG. 1 is a partial sectional view of an electrical connector according to the invention.

FIG. 2 is an enlarged perspective view of a flexible electrical contact according to the invention.

FIG. 3 is an enlarged side view of another flexible electrical contact according to the invention.

FIG. 4 is a top view illustrating the method of forming the flexible electrical contact according to the invention.

FIG. 5 is a top view illustrating the method of forming another embodiment of the flexible electrical contact according to the invention.

DETAILED DESCRIPTION OF THE INVENTION

According to the invention there is disclosed an electrical device comprising first and second electrical components and at least one longitudinally-dimensioned flexible electrical contact connecting the first electrical component to the second electrical component. Usually, there will be a plurality of such flexible contacts. The flexible contact (or contacts) has a center portion of greater flexibility than its two end portions. The center portion has the greater flexibility along, and laterally with respect to, the longitudinal axis of the flexible contact.

Referring to the drawings in more detail, and particularly referring to FIG. 1, there is shown an electrical connector, generally denoted by 10. The electrical connector 10 comprises a first electrical component 12 and a second electrical component 14. As shown in FIG. 1, for purposes of illustration and not of limitation, the first component is a mother board and the second component is a socket insert. In use, the socket insert 14 would be inserted into a suitable housing 16 and held there by retention clips 18. The socket insert would be connected to the mother board by a plurality of suitable electrical contacts 20. As shown in FIG. 1, these electrical contacts 20 are flexible electrical contacts. Each of the flexible contacts has a center portion, generally denoted by 22, of greater flexibility than its two end portions 24, 26. The center portion 22 has the greater flexibility along its longitudinal axis, denoted by arrow 28, as well as laterally, denoted by arrow 30, with respect to the longitudinal axis. That is, these flexible electrical contacts are able to flex laterally in any direction as well as along their longitudinal axis due to the greater flexibility of the flexible contacts. Thus these flexible electrical contacts are able to accommodate any relative misalignment between the socket insert and the mother board.

The electrical contacts 20 will typically be soldered to the mother board. However, the socket insert and/or the housing are able to move relative to the mother board. This being the case, stress on the soldered joints may arise during movement of the electrical contacts as a result of mating forces. The flexible contacts according to the invention are able to accomodate and reduce this stress.

The problem that the invention has been designed to solve has been to be able to connect a pair of electrical components by at least one and usually a plurality of electrical contacts and yet have the electrical contacts accommodate any misalignment between the two components as well as to absorb vibration and reduce stress. It is also necessary that the flexible contacts be durable and reliable over many years of service and also over many matings and dematings of the electrical components.

One solution is to form the electrical contact of the typical metallic material that electrical contacts are made from, such as beryllium copper, and then zone anneal the center portion of the electrical contact. Alternatively, the electrical contacts may be zone annealed prior to forming of the contact. In this way the end portions of the electrical contact are in their higher strength condition and thus are able to generate sufficient mating forces. On the other hand, the center portion, being zone annealed, is relatively soft and thus has greater flexibility as well as higher elongation than the two end portions. Accordingly, the center portion of the flexible contact is able to move relative to its two end portions to accommodate relative misalignment of the mating electrical components.

In use, the socket insert 14 may have a plurality of apertures (not shown) on the top portion 32 of the socket insert for receiving another electrical component having pin contacts. Alternatively the first and second electrical components shown in FIG. 2 may be the entire electrical connector. It should be understood that the invention relates generally to the connection of two electrical components and that components other than that shown in FIG. 1 are contemplated within the scope of the invention.

It is also within the scope of the invention to include in the connector a retaining member such as that disclosed in Wong et al U.S. Pat. No. 4,655,382, entitled "Materials for Use in Forming Electronic Interconnect", the disclosure of which is incorporated herein by reference. In this reference, there is disclosed a water soluble retaining member for aligning a plurality of electrically conductive elements with an electrical component. Once the conductive elements are aligned and connected with the electrical component, the retaining member may and usually will be dissolved. When there is such a retaining member in the connector, the flexibility of the electrical contact is not so important during mating of the electrical components since misalignment is not a problem. The flexibility is, nevertheless, important in withstanding vibration, mishandling, etc. of the connector as well as subsequent dematings and matings of the electrical components.

According to the invention there is also disclosed an electrical connector comprising first and second electrical components and a plurality of longitudinally-dimensioned flexible electrical contacts connecting the first electrical component to the second electrical component. Usually, there will be a plurality of such flexible contacts. The flexible contact (or contacts) has a bellows center portion of greater flexibility than its two end portions.

As can be appreciated this electrical connector is basically the same as that shown in FIG. 1 in that there is a first 12 and second 14 electrical component and at least one but usually a plurality of longitudinally-dimensioned flexible electrical contacts 20 connecting the first and second electrical components. In this connector however the flexible contacts have a bellows center portion of greater flexibility than its two end portions. This flexible contact is shown in more detail in FIG. 2.

As shown in FIG. 2 there is a greatly enlarged view of a flexible electrical contact 20. It can be seen that the electrical contact is generally hollow and tubular in shape. In the center portion of the flexible contact there is a bellows formed therein, generally indicated by 34. This bellows acts to enhance the flexibility of the electrical contact. It is entirely within the scope of the invention for the bellows to extend entirely around the periphery of the electrical contact. However, primarily as a result of the manufacturing process required to make the flexible contact, it has been found that it is most preferred that the bellows have longitudinal slots 36 therein. The bellows then is defined by convolutions 35 extending discontinuously around the periphery of the electrical contact. That is, the longitudinal slots interrupt the convolutions of the bellows.

As shown in FIG. 2, the bellows has two longitudinal slots 36. One longitudinal slot faces out from the paper and the other longitudinal slot is on the opposite side of the electrical contact, hidden from the viewer. It is preferred that the bellows has at least two of these longitudinal slots. Also as shown in FIG. 2 the slots extend the entire longitudinal length of the convolutions. Again, due to the manufacturing process for making these flexible contacts, it is desirable that the slots extend the entire longitudinal length of the convolutions.

The convolutions may be hoop-like, as shown in FIG. 2, or may be helical.

Referring now to FIG. 3 there is a side view of another embodiment of the flexible electrical contact 120. This electrical contact 120 is similar to the electrical contact 20 shown in FIG. 2; however, this electrical contact 120 has four longitudinal slots 136 therein. It has been found that the more longitudinal slots within the center portion of the electrical contact the better will be its flexibility. Too, the more slots the less will be the tendency for the bellows to exhibit any directional properties. However, due to the very small size of the electrical contacts contemplated in use, the number of slots is extremely limited and, as a practical matter, four is the maximum number of slots possible.

FIG. 3 also illustrates another embodiment of the invention. In FIG. 3 the slots 136 extend longitudinally past the convolutions 135. The advantage of this is that by extending the slots past the convoluted area, a semi-flexible region is created that acts as a transition between the rigid end portions of the electrical contact and the flexible center portion of the electrical contact.

By now it must be appreciated that an important aspect of the invention relates to the flexible electrical contact itself. Thus, according to the invention there is disclosed a longitudinally-dimensioned flexible electrical contact comprising a center portion of greater flexibility than its two end portions. The center portion comprises a bellows having longitudinal slots therein and being defined by convolutions extending discontinuously around its periphery.

It is expected that the flexible electrical contacts according to the invention, such as those shown in FIGS. 2 and 3, may be sold as a separate article of commerce or may be incorporated into an electrical device such as that shown in FIG. 1.

As alluded to earlier, the finer details of the flexible electrical contact such as that shown in FIG. 2 are to a large extent dictated by the manufacturing process. As a result of the very small size of these electrical contacts (on the order of about 0.015 inches), it is extremely difficult as well as impractical to make the electrical contacts with the bellows extending continuously around the periphery of the contact. It has been found, however, that an electrical contact may be easily fabricated wherein the bellows extends discontinuously around the periphery of the electrical contact.

Thus, according to the invention there is disclosed a method of making a flexible electrical contact comprising forming a generally planar longitudinally-dimensioned article having a center portion, cutting longitudinal slots in the center portion, corrugating the center portion, and rolling the article into a hollow, generally tubular shape with the center portion forming a bellows.

Referring now to FIG. 4 there is illustrated the method of making the flexible electrical contacts of the invention. There is shown a generally planar longitudinally dimensioned article 40 having longitudinal slots 42 and corrugations 44 in the center portions. Normally, there will be a plurality of these longitudinally-dimensioned articles 40 attached to a carrier 46 by tabs 48. The carrier 46 may also have tractor feed holes 50 for assisting in the movement of the carrier. In practice such an article as shown in FIG. 4 may be formed all in one step such as by a stamping process. The next step in the process would be to roll each of the articles 40 into a hollow, generally tubular shape. As the article is rolled into its tubular shape, the tabs 48 holding the article to its carrier 46 would also be rolled and twisted, eventually weakening the tabs. Upon completion of the rolling process the articles 40 may be easily broken off from its carrier 46 by tearing or breaking tabs 48.

As shown in FIG. 4, the longitudinal slots 42 are straight. It is also within the scope of the invention to form the slots in a curvilinear fashion, as shown in FIG. 5. The advantage of forming curvilinear slots is that the flexibility of the center portion is markedly increased.

The number and amplitude of the convolutions of the bellows can be varied to fit the particular flexibility requirements of the situation. By increasing the convolutions and their amplitude, the flexibility of the contact is increased. However, by making larger amplitude convolutions the diameter of the contact is made larger and by simultaneously increasing the number of convolutions, the length of the contact will increase. Due to the extremely small size of these electrical contacts as well as their spacing requirements in use, the length of the convolutions and their amplitude, as a practical matter, will be limited as one skilled in the art can appreciate.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

I claim:

1. An electrical device comprising:
   first and second electrical components and at least one longitudinally-dimensioned flexible electrical contact connecting said first electrical component to said second electrical component, said flexible contact having a bellow center portion which has longitudinal slots therein and is defined by convolutions extending discontinuously around its periphery, and which is of greater flexibility than its two end portions.

2. The electrical device of claim 1 wherein there are a plurality of said flexible contacts.

3. The electrical device of claim 1 wherein the bellows has at least two longitudinal slots therein.

4. The electrical device of claim 1 wherein the bellows has four slots therein.

5. The electrical device of claim 1 wherein the slots extend the longitudinal length of the convolutions.

6. The electrical device of claim 1 wherein the slots extend longitudinally past the convolutions.

7. The electrical device of claim 1 wherein the slots are curvilinear.

8. A longitudinally-dimensioned flexible electrical contact comprising a center portion of greater flexibility than its two end portions, said center portion comprising a bellows having longitudinal slots therein and being defined by convolutions extending discontinuously around its periphery.

9. The flexible contact of claim 8 wherein the bellows has at least two longitudinal slots therein.

10. The flexible contact of claim 8 wherein the bellows has four slots therein.

11. The flexible contact of claim 8 wherein the slots extend the longitudinal length of the convolutions.

12. The flexible contact of claim 8 wherein the slots extend longitudinally past the convolutions.

13. The flexible contact of claim 8 wherein the slots are curvilinear.

14. A method of making a flexible electrical contact comprising:

forming a generally planar longitudinally-dimensioned article having center portion;

cutting longitudinal side-by-side slots in the center portion;

corrugating the center portion, so as to form a plurality of alternating ridges and grooves extending generally circumferentially of the contact, between the ends of each slot; and rolling the article into a hollow, generally tubular shape with the center porton forming a bellows.

15. The method of claim 14 wherein the steps of forming, cutting and corrugating occur simultaneously.

16. The method of claim 14 wherein the steps of forming, cutting and corrugating occur by stamping.

17. An elongate flexible electrical contact which comprises:

(a) two end portions; and (b) a center portion between the end portions, having formed therein:

(i) a plurality of slots extending side-by-side generally longitudinally of the contact; and (ii) a plurality alternating ridges and grooves extending generally circumferentially of the contact, between the ends of each slot;

the center portion of the contact being of greater flexibility than the end portions.

18. A contact as claimed in claim 17, in which the slots and the alternating ridges and grooves are formed in substantially the entire length of the center portion of the contact.

19. A contact as claimed in claim 17, in which the slots extend longitudinally beyond that portion of the contact that has the ridges and grooves formed therein.

20. A contact as claimed in claim 17, in which the slots are curvilinear.

* * * * *